United States Patent [19]

Kakimoto et al.

[11] Patent Number: 4,894,834
[45] Date of Patent: Jan. 16, 1990

[54] SEMICONDUCTOR LASER AND METHOD FOR PRODUCTION THEREOF

[75] Inventors: Syoichi Kakimoto; Masatoshi Fujiwara; Syogo Takahashi, all of Itami, Japan

[73] Assignee: Mitsubishi Denki Kabushiki Kaisha, Japan

[21] Appl. No.: 321,529

[22] Filed: Mar. 9, 1989

[30] Foreign Application Priority Data

Mar. 16, 1988 [JP] Japan .................................. 63-64521

[51] Int. Cl.⁴ .............................................. H01S 3/19
[52] U.S. Cl. ..................................................... 372/44
[58] Field of Search ....................... 372/44, 45, 46, 47, 372/50

[56] References Cited

U.S. PATENT DOCUMENTS 4,680,768 7/1987 Yagi ...................................... 372/44

OTHER PUBLICATIONS

"GaInAsP/InP Phase-Adjusted Distributed Feedback Lasers With a Step-Like Nonuniform Stripe Width Structure" by Soda et al., Electronics Letters, Nov. 22nd, 1984, vol. 20, pp. 1016-1018.

*Primary Examiner*—William L. Sikes
*Assistant Examiner*—Robert E. Wise
*Attorney, Agent, or Firm*—Leydig, Voit & Mayer

[57] ABSTRACT

A distributed feedback semiconductor laser which achieves a phase shift for stabilizing the longitudinal mode without a substantial increase in reactive current and without introducing dimensional discontinuities in the laser stripe. The active layer of the laser is configured as a multi-quantum well and impurities are selectively diffused into the multi-quantum well to disorder a selected portion of the active layer. The disordered portion has an optical propagation constant which is different than that of the remaining stripe, and the difference in propagation constant coordinated with the length of the phase adjustment section produces a phase shift adequate to stabilize the laser longitudinal mode.

10 Claims, 1 Drawing Sheet

SEMICONDUCTOR LASER AND METHOD FOR PRODUCTION THEREOF

FIELD OF THE INVENTION

This invention relates to semiconductor lasers, and more particularly to distributed feedback type semiconductor lasers.

BACKGROUND OF THE INVENTION

Distributed feedback (DFB) semiconductor lasers have been developed and are described, for example, in "GaInAsP/InP Phase-Adjusted Distributed Feedback Lasers With a Step-Like Nonuniform Stripe Width Structure" by Soda et al., Electronics Letters, 22nd November 1984, Vol. 20, pp. 1016–1018. In such DFB lasers, a longitudinally disposed diffraction lattice is associated with the laser active layer for Bragg reflecting light of the design wavelength, thereby to exhibit wavelength selectivity for the output laser oscillation. It has been found, however, that the longitudinal mode oscillation does not occur at precisely the Bragg wavelength (twice the length of a period of the diffraction lattice), but exhibits two peaks, one on either side of the Bragg wavelength and displaced from the Bragg wavelength by equal amounts. A possible reason for such behavior is that photon emissions at the Bragg wavelength which reciprocate in the resonator return to their original position shifted by $\pi$ radians and thus cancel. The result is that oscillation at the Bragg wavelength is cancelled, and oscillation then is at two peaks bracketing the Bragg wavelength separated by a null at the Bragg wavelength. It is appreciated that the two peak mode is undesirable and efforts have been made to stabilize the distributed feedback laser at a single longitudinal mode.

One such effort is illustrated in the aforementioned Soda et al. article. That article proposes introducing a phase shift in the laser stripe of $\pi/2$ radians resulting in single longitudinal mode operation at the Bragg is desirable, the means of achieving it introduces other undesirable characteristics. More particularly, in order to introduce a phase shift into the laser stripe, the stripe was made nonuniform in shape, having a step-like increase in stripe width for a portion of the stripe length. That increase in stripe width reduced the laser efficiency because current which flowed through the added step-like portions does not contribute to the laser output. The step also introduces the possibility of scattering light at the steps and thereby disturbing the radiation pattern.

The laser described in the aforementioned article utilized InGaAsP series material. Were the phase adjusting technique to be applied to a AlGaAs type laser, the structure would appear as illustrated in FIG. 2. The laser of FIG. 2 is based on an n-type GaAs substrate 1. Epitaxially ground on the substrate 1 is an n-type AlGaAs buffer layer 2. Corrugations 3 of the desired depth and period are then formed in the buffer layer 2 such as by using holographic photolithography to form a mask for the pattern and etching to form the pattern itself.

Subsequent to formation of the corrugation pattern 3, a second phase epitaxial growth process is utilized to successively deposit n-type AlGaAs guide layer 4, AlGaAs active layer 5, p-type AlGaAs cladding layer 6, and p-type GaAs contact layer 7. The molar proportion of aluminum in the active layer 5 is substantially less than that in the cladding layer 6 to aid in confining emitted photons within the active and guide layers 5, 4.

After the second phase epitaxial growth phase is completed, the device is masked and etched to remove longitudinal side portions 8, 9 leaving a stripe-like central mesa portion 10. It is seen from the drawing that formation of the mesa 10 is accomplished by removal of portions of layers 2, 4, 5, 6 and 7. In order to achieve the desired phase shift, the mesa 10 is not formed in the shape of a uniform stripe as is conventional, but has a step-like expanded portion 12 intermediate a pair of uniform stripe width regions 13. In the disclosed embodiment, the thickened portion 12 is about 60 microns in length out of a total stripe length of 400 microns, and is about 3 microns wide as compared to the 2 microns for the uniform stripe width portion.

After etching of the mesa, a third epitaxial growth phase is conducted to cover the two sides of the mesa, thereby burying the heterojunction formed in the active layer 5 between the p-type cladding layer 6 and the n-type guide layer 4. A first p-type AlGaAs embedded layer 15 is grown followed by an n-type AlGaAs embedded layer 16 having an upper surface which is substantially planar with the contact layer 7. The embedded layer 15 serves to stabilize the transverse mode, and the reversed bias p–n junction formed between the layers 15–16 reduces leakage current through the device.

Following completion of the final epitaxial growth phase, p side and n side electrodes 17, 18 are formed on the upper and lower surfaces, respectively, of the laser. Anti-reflective films 19 such as $Si_3N_4$ are formed on the laser facets to eliminate the influences of reflectivities of the laser end surfaces.

In operation, when a d-c voltage source is connected to the electrodes 17, 18 to forward bias the p-n junction formed between the layers 6 and 4, carriers are injected into the active layer 5 causing the production of coherent radiation. Photons are generated and are confined within the stripe section of the active and guide layers 5, 4 oscillating between facets until they are ultimately ejected through one of the facets to produce a beam of coherent radiation. The period of the corrugations in the layer 2 determines the wavelength of the light which is produced. By virtue of the greater stripe width at the step-like portion 12, the propagation constant at that portion is different than that of the uniform stripe regions 13. Thus, the difference in propagation constant $\Delta\beta$ multiplied by the effective length of the step-like portion 12 creates a phase shift for light traveling in the stripe region. When this phase shift is adjusted to be about $\pi/2$ radians, such as by making the thickened portion about 60 microns long as noted above, the phase shift approximates $\pi/2$ and it is found that the longitudinal mode of the laser is stabilized at a single frequency which is at about the Bragg wavelength.

However, it will also be appreciated that the only current which contributes to light output is that which flows through the uniform width section of the laser stripe, i.e., the portions 13 and the central portion of the region 12. Current, however, also flows through the step portions of the region 12, i.e., the portions which extend beyond the uniform portions, and that current does not contribute to laser output light. That portion of the current can be considered reactive current, i.e., current which is supplied to the laser but does not contribute to light output. Instead, that current is dissipated as heat, and that is undesirable because it causes an increase in operating temperature of the laser device. In a laser with a 2 micron by 400 uniform stripe size and a 3 micron by 60 micron steplike thickened portion, approximately 7.5% of the laser area which is passing current produces no light output. A further disadvantage also appears to be introduced by the thickened portion, namely, the discontinuity in width has an effect in scattering the radiation which is produced, thereby disturbing the pattern of light output.

SUMMARY OF THE INVENTION

In view of the foregoing, it is a general aim of the present invention to provide a distributed feedback semiconductor laser which is stabilized to a single longitudinal mode but which does not pay a penalty in efficiency as does the prior art discussed above.

In accomplishing that aim, it is an object of the present invention to provide a phase shift in a stripe region of a DFB laser in such a way that current flow through the phase adjustment portion is avoided.

In accordance with the invention, there is provided a distributed feedback semiconductor laser in which an active layer, a corrugated light guide layer and a cladding layer are associated in a particular manner. The active layer is a multi-quantum well, and all of the layers are formed in a stripe having a longitudinal axis which is perpendicular to the corrugations in the light guide layer. Phase shift means in the active layer introduces a phase shift, the phase shift means comprising impurities diffused into a relatively small length of the active layer stripe for disordering the multi-quantum well and thereby changing the propagation constant in the disordered length. In a preferred practice of the invention, the change in propagation constant is coordinated to the length of the disordered region to produce a phase shift of about $\pi/2$ radians which tends to stabilize the longitudinal mode of the laser about the Bragg wavelength.

It is a feature of the present invention that a phase shift is provided in the stripe region of a DFB laser in such a way as to avoid conducting current through the phase adjustment portion thereby to reduce reactive current in the laser.

According to the invention, such phase adjustment portion is provided by configuring the active layer as a multi-quantum well and diffusing impurities, preferably zinc, into the multi-quantum well to disorder a defined portion thereof, the disordered portion providing the desired phase shift.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from this detailed description.

DETAILED DESCRIPTION OF THE PREFERRED EMBODIMENTS

While the invention will be described in connection with a preferred embodiment, there is no intent to limit it to that embodiment. On the contrary, the intent is to cover all alternatives, modifications and equivalents included within the spirit and scope of the invention as defined by the appended claims.

Figure 1:
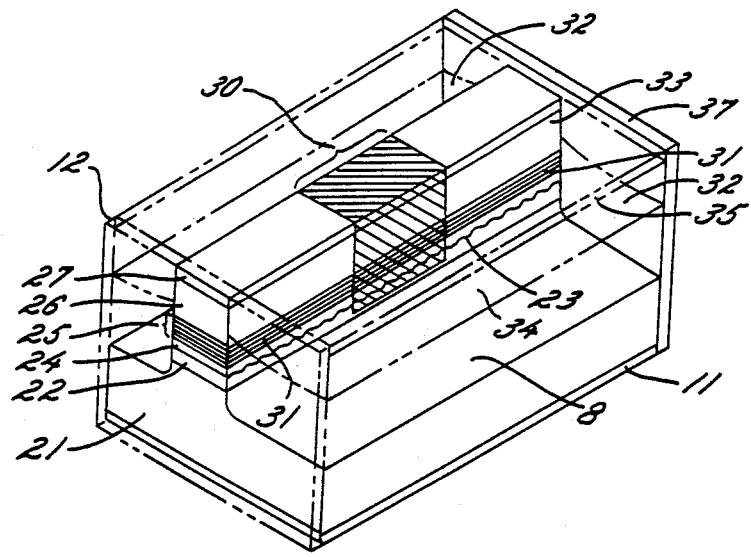
FIG. 1 is a diagram illustrating a DFB laser exemplifying the present invention.
Figure 2:
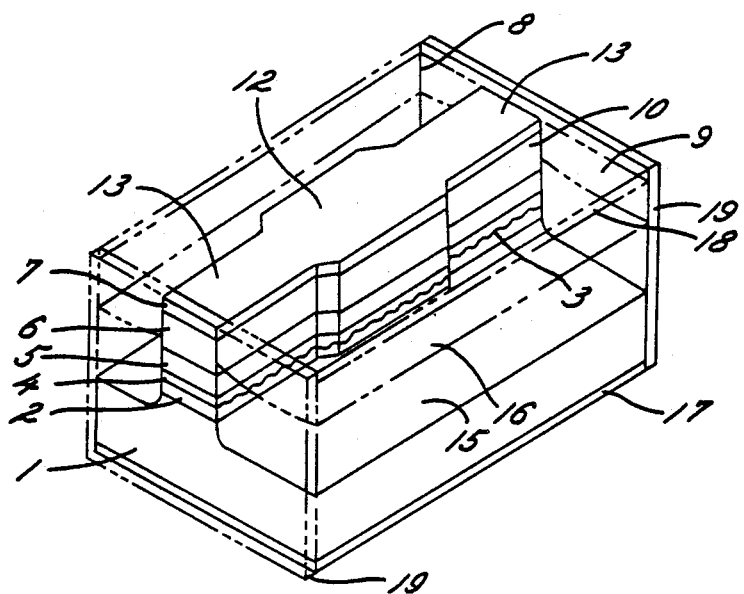
FIG. 2 is a diagram similar to FIG. 1 but showing a prior art DFB semiconductor laser.

Turning now to the drawings, FIG. 1 illustrates a DFB semiconductor laser exemplifying the present invention. The laser is based on an n-type GaAs substrate 21 which has a buffer layer 22 of n-type AlGaAs grown thereon in a first epitaxial growth phase. As in the FIG. 2 device, following the growth of the buffer layer, a corrugation pattern is formed thereon, preferably by means of holographic photolithography and etching. Corrugations form a diffraction lattice which has a period which determines the frequency of the laser oscillations.

A second phase epitaxial growth is then accomplished to produce successively light guide layer 24, a multi-quantum well layer 25, upper cladding layer 26, and contact layer 27. The light guide layer 24 is n-type AlGaAs and is grown in such a way as to produce a substantially planar surface for receiving the multi-quantum well. The multi-quantum well layer 25, as is well known, is formed of very thin alternating barrier and well layers, the barrier layers comprising AlGaAs and the well layers GaAs the higher band gap of the AlGaAs barrier materials tends to confine carriers within the lower band gap GaAs well layers. The respective barrier layers typically are on the of 100 angstroms or less. The layers 26 and 27 are p-doped, the cladding layer 26 being p-type AlGaAs and the contact layer 27 being p-type GaAs.

Following completion of the epitaxial growth phase, a silicon nitride mask is formed over the contact layer 27 to define a region 30 of predetermined length within the laser stripe. The patterning is typically accomplished by forming a silicon nitride film on the contact surface 27, then etching away the central portion thereof. Following formation of the mask, the device is inserted into a diffusion furnace and zinc impurities are diffused into the un-masked central portion. Diffusion is conducted under conditions which assure that impurities diffuse through the active layer 25, and also so that the diffusion front terminates in either the AlGaAs buffer layer 22 or the AlGaAs guide layer 24. It is known that diffusion of zinc impurities through a multi-quantum well causes disordering of the multi-quantum well, "mixing" the separate AlGaAs and GaAs layers to form a uniform AlGaAs bulk crystal in which the average of the barrier and well properties presides. At the same time, the end portions 31 of the multi-quantum well which receive no impurities retain their multi-quantum well structure. The AlGaAs in the central portion 30, by virtue of its aluminum content, has a lower index of refraction and a lower propagation constant than the GaAs in the well portions in the end sections 31. The length of the section 30 is coordinated to the difference in propagation constant $\Delta\beta$ such that the product of the two introduces the desired phase shift such as $\pi/2$ radians.

Following the diffusion induced disordering of the multi-quantum well, the diffusion mask is removed, and the device remasked for formation of the mesa. The device is etched until side portions 32 of the layers 22, 24, 25, 26 and 27 are removed, forming a mesa 33 bracketed by a pair of indentations 32. The mesa is seen to be in the form of a stripe having a longitudinal axis perpendicular to the corrugations. As in the prior art device, a final epitaxial growth phase is conducted to produce embedded layers 33, 34, the embedded layer 33 being of p-type AlGaAs and the embedded layer 34 being of n-type AlGaAs. The embedded layers serve to stabilize the transverse mode by providing a refractive index discontinuity at the junction with the mesa and also provide a reverse biased p-n junction enclosing the mesa to reduce reactive current.

As in the prior art device, following the final epitaxial growth phase, p and n contacts 35, 36 are formed on the contact layer 27 and substrate 21, respectively. Antireflection films 37 of silicon nitride are also formed on the laser facets.

As noted above, the disordered region 30 within the active layer 25 creates bulk AlGaAs crystal which has a propagation constant for photons in the active layer which is different than the GaAs well layers of the multi-quantum well. That propagation constant difference $\Delta\beta$, when multiplied by the length of the section 30 is coordinated to produce a desired phase shift such as the $\pi/2$ radians discussed in connection with the prior art. In a typical device having a length of 300 microns, a relatively small proportion of that length should be disordered on the order of 20 to 30 microns in order to produce the necessary phase shift. In most conditions, a phase shift of $\pi/2$ will cause the DFB laser to oscillate at about the Bragg wavelength and stabilize the single longitudinal mode.

In accordance with the invention, the disordered region 30, while it does not contribute to the production of light, also does not pass any current and thus does not contribute to reactive current losses in the laser. As shown in FIG. 1, impurities which are diffused into the central region reach no further than the buffer layer 22. It is know that zinc is a p-type impurity in AlGaAs, and thus a p-n junction is produced between the lower portion of disordered region 30 and the n-type buffer layer 22. However, the electrical potential in the depletion zone at that p-n junction is higher than the potential in the depletion zone of the p-n junction encompassing the multi-quantum well 25. Thus, the threshold for the latter p-n junction is lower and current will be conducted preferentially through that junction rather than the p-n junction formed between the disordered region 30 and the n-type buffer layer 22. As a result, little or no current will flow through the region 30, the reverse biased p-n junction between the embedded layers 33 and 34 will conduct virtually no current, and substantially all of the current flow through the device will be through the end sections 31. Thus, a structure according to the invention achieves the desired phase shift in the laser stripe without either increasing its size widthwise, or passing reactive current through the device. Efficiency is thus enhanced and lower temperature operation can result.

Although the preferred embodiments were described in connection with a DFB semiconductor laser using AlGaAs series material, the invention can also be applied in accordance with the foregoing principles to other semiconductor materials such as InGaAsP series material.

The preferred embodiments were also described in connection with a single phase adjustment region intermediate uniform stripe regions. However, it is also possible to divide the phase adjustment region into a number of separate lengths distributed throughout the stripe. In that case, the amount of phase adjustment will be equal to the sum of the phase adjustment of the individual regions which, if the change in propagation constant in each of the regions is the same, will be equal to that change times the sum of the lengths of the individual regions.

In most lasers it will be desirable to introduce a phase shift of approximately $\pi/2$ radians as described above. However, in some lasers, particularly under high power operation, a phase adjustment of a different magnitude may be needed in order to cause the laser to oscillate at about the Bragg wavelength. For example, it is believed that under high power operation, influences of injected carrier concentration distribution may cause local changes in propagation constant, this requiring a phase shift having a magnitude over than $\pi/2$. Thus, in some cases, the product of the propagation constant difference $\Delta\beta$ and the length of phase adjustment region may be equal to $\pi/4$ or $\pi/8$ in order to stabilize the longitudinal mode at the Bragg wavelength. Such a phase adjustment is readily provided by the present invention since it requires merely a calculated change in the diffusion mask to achieve a phase adjustment length of any desired magnitude.

While zinc is used as the preferred dopant for disordering the superlattice, other means are available for accomplishing the same result, including diffusion from the vapor phase or solid phase of other, dopants, and also ion implantation or selective annealing techniques.

In all cases, according to the present invention, a distributed feedback laser is provided having a central stripe which is of uniform size but incorporates therein a phase adjustment region. The phase adjustment region is achieved by configuring the laser with an active layer comprising a multi-quantum well, then disordering a selected portion of the multi-quantum well active layer to produce an optical propagation constant in the disordered portion which is different than the propagation constant in the remainder of the stripe. As a result, an increase in reactive current and a corresponding decrease in efficiency can be avoided. Discontinuities in the stripe dimensions are avoided to avoid disturbing the radiation pattern of the laser.

What is claimed is:

1. A distributed feedback semiconductor laser comprising, in combination, an active layer associated on one side with a corrugated light guide and on the other side with a cladding layer, the cladding layer and corrugated light guide being of opposite conductivity types, the active layer being a multi-quantum well having alternating well and barrier layers, the active layer, light guide and cladding layers being formed into a stripe having a longitudinal axis perpendicular to the corrugations, and phase shift means in the active layer for introducing a phase shift, said phase shift means comprising a relatively small length of the active layer stripe in which the multi-quantum well is disordered by impurity diffusion thereby altering the propagation constant in the disordered length.

2. The distributed feedback semiconductor laser of claim 1 in which the diffused impurities comprise zinc.

3. The distributed feedback semiconductor laser of claim 1 wherein the disordered length of the active layer is intermediate two nondisordered lengths.

4. The distributed feedback semiconductor laser of claim 1 in which the product of the propagation constant change and the length of the disordered region approximates $\pi/2$ radians.

5. The distributed feedback semiconductor laser of claim 1 in which the stripe is of uniform width.

6. A method of introducing a controlled phase shift into a distributed feedback semiconductor laser comprising the steps of associating an active layer comprising a multi-quantum well with a light guide and a cladding layer, configuring the active layer as a stripe having a pair of parallel sides defining a longitudinal axis of the laser, and disordering a controlled portion of the length of the stripe of the active layer by diffusing impurities into the multi-quantum well thereby to alter the propagation constant of the multi-quantum well in the disordered portion.

7. The method of claim 6 in which the disordering step comprises diffusion of zinc impurities into the multi-quantum well.

8. The method of claim 6 wherein the disordering step comprises disordering an intermediate length of the stripe leaving nondisordered length of the stripe at either end.

9. The method of claim 6 in which the disordering step further comprises determining the length of the stripe to be disordered such that the product of the difference in propagation constant and the length of the disordered region approximates $\pi/2$ radians.

10. The method of claim 6 in which the configuring step comprises configuring the active layer as a stripe of uniform width.

* * * * *